(12) United States Patent
Treiber et al.

(10) Patent No.: US 6,437,988 B1
(45) Date of Patent: *Aug. 20, 2002

(54) CARD GUIDE AND METHOD OF GUIDING CIRCUIT BOARDS

(75) Inventors: Mark R. Treiber, Philadelphia; Terry W. Louth, Narvon, both of PA (US)

(73) Assignee: Unisys Corporation, Blue Bell, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/748,941

(22) Filed: Dec. 27, 2000

Related U.S. Application Data

(63) Continuation of application No. 09/595,983, filed on Jun. 16, 2000, now Pat. No. 6,269,006.

(51) Int. Cl.[7] .................................................. H05R 5/00

(52) U.S. Cl. ........................... 361/756; 361/801; 439/59

(58) Field of Search .................................. 361/756, 741, 361/801, 802; 439/59–66, 377; 312/223.1, 223.2

(56) References Cited

U.S. PATENT DOCUMENTS

| | | |
|---|---|---|
| 3,731,157 A | 5/1973 | Reimer |
| 3,736,472 A | 5/1973 | Muldoon, Jr. |
| 3,878,438 A | 4/1975 | Weisman |
| 3,898,536 A | 8/1975 | Wyshak et al. |
| 3,899,721 A | 8/1975 | Borchard et al. |
| 4,007,403 A | 2/1977 | Fiege |
| 4,327,835 A | 5/1982 | Leger |
| 5,467,254 A | 11/1995 | Brusati et al. |
| 5,533,631 A | 7/1996 | Marchetti |
| 5,724,231 A | 3/1998 | Winick et al. |
| 5,738,226 A | 4/1998 | Dean |
| 5,828,556 A | 10/1998 | Zenitami et al. |

*Primary Examiner*—Kamand Cuneo
*Assistant Examiner*—Tuan Dinh
(74) *Attorney, Agent, or Firm*—Ratner & Prestia; Mark T. Starr; Lise A. Rode

(57) ABSTRACT

A card guide is provided for guiding an edge portion of at least one circuit board with respect to a computer chassis. The card guide includes flanges defining recesses. At least one of the recesses is configured to mount the card guide to the computer chassis. Each of the recesses is configured to receive the edge portion of a circuit board, and the flanges of the body are spaced from one another to accommodate the edge portion of a circuit board to guide the circuit board with respect to the computer chassis.

25 Claims, 13 Drawing Sheets

CARD GUIDE AND METHOD OF GUIDING CIRCUIT BOARDS

This is a continuation application of application Ser. No. 09/595,983, which is a U.S. Pat. No. 6,269,006, filed on Jun. 16, 2000, and the entire disclosures of which are incorporated herein by reference.

FIELD OF THE INVENTION

This invention relates to a card guide and method of guiding circuit boards. More specifically, this invention relates to a card guide for guiding an edge portion of at least one circuit board with respect to a support member of a computer chassis, a computer chassis configured to receive at least one circuit board, and a method for guiding edge portions of circuit boards with respect to an elongated support member of a computer chassis.

BACKGROUND OF THE INVENTION

This invention addresses issues relating to the insertion of cards such as printed circuit boards into a computer system for connection to a mating connector within the computer system. When a card is inserted into a computer system for engagement with a connector, a significant degree of guidance is required in order to ensure that the connector is properly seated. The need for guidance is even more critical when the card being inserted has a substantial length. Also, as the number of pins of the mating connectors increases, the potential for damage to these pins is increased if guidance of the card is inadequate upon insertion. These factors also apply upon extraction of a card from a computer system so as to ensure proper disengagement of the mating connectors without damage to the pins of the connectors.

It has been proposed to modify the structure of a computer's chassis to form guides for cards to be inserted therein. For example, a sheet metal structure of a computer's chassis can be formed to include flanges that guide the cards upon insertion. Although the forming of guides in the sheet metal of the computer chassis provides an adequate solution, the use of metallic guides can limit the proximity to the card's edge at which components on the card can be positioned in order to avoid contact.

Also, in some circumstances, it is desirable to install multiple printed circuit boards into a computer system in a stacked relationship. In order to provide such a stacked configuration, it may be necessary or desirable to orient the printed circuit boards along a common plane such that an edge of one of the printed circuit boards is proximal to an edge of another printed circuit board. For example, such stacked insertion may result in the orientation of printed circuit boards along a common plane wherein one of the printed circuit boards is positioned directly above another one of the printed circuit boards.

It has been proposed to modify the structure of a computer's chassis to form guides for stacked cards by forming sheet metal structures that include flanges to guide the cards upon insertion. Although such guides may provide an adequate solution, such guides often require two thicknesses of sheet metal between the edges of the cards. This results in wasted space within the computer's chassis.

Accordingly, there remains a need for a low cost card guide design that is configured for guiding an edge portion of at least one circuit board with respect to a support member of a computer chassis.

SUMMARY OF THE INVENTION

One aspect of this invention provides a card guide for guiding an edge portion of at least one circuit board with respect to a computer chassis. The card guide includes flanges defining recesses. At least one of the recesses is configured to receive a portion of the computer chassis to mount the card guide to the computer chassis. Each of the recesses is configured to receive the edge portion of a circuit board, and the flanges are spaced from one another to accommodate the edge portion of a circuit board to guide the circuit board with respect to the computer chassis.

According to another aspect of this invention, a computer chassis is provided that is configured to receive at least one circuit board. The computer chassis includes an elongated support member and a card guide according to this invention.

According to yet another aspect of this invention, a computer system is provided including a chassis having an elongated support member, at least one circuit board having an edge portion positioned adjacent the elongated support member of the chassis, and a card guide according to this invention.

According to still another aspect of this invention, a method is provided for guiding edge portions of circuit boards with respect to an elongated support member of a computer chassis. The method includes providing a card guide having flanges defining elongated recesses. The elongated support member of the computer chassis is engaged with a pair of the flanges of the card guide. The circuit boards are guided with respect to the computer chassis by receiving the edge portions of the circuit boards in the recesses of the card guide.

DETAILED DESCRIPTION OF THE INVENTION

Figure 1:
FIG. 1 is a top view of a card guide.

This invention will now be described with reference to several embodiments selected for illustration in the drawings. It will be appreciated that the scope and spirit of the invention is not limited to the illustrated embodiments. It will further be appreciated that the drawings are not rendered to any particular proportion or scale. Also, any dimensions referred to in the description of the illustrated embodiments are provided merely for the purpose of illustration. The invention is not limited to any particular dimensions, materials, or other details of the illustrated embodiments.

Figure 2:
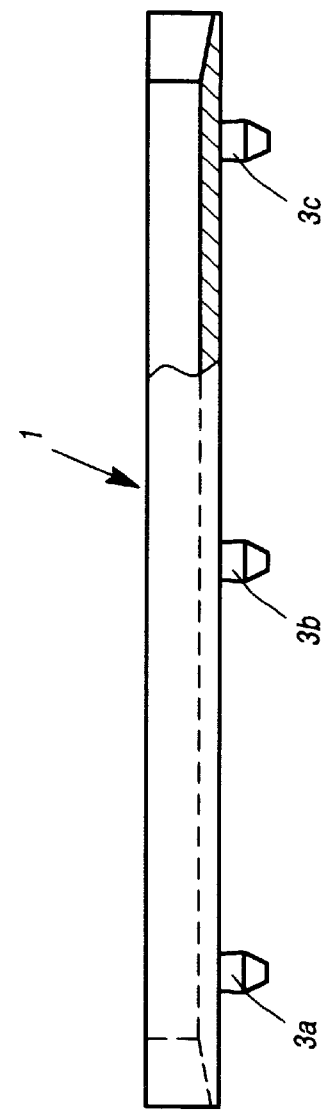
FIG. 2 is a partial cross-sectional side view of the card guide shown in FIG. 1.
Figure 3:
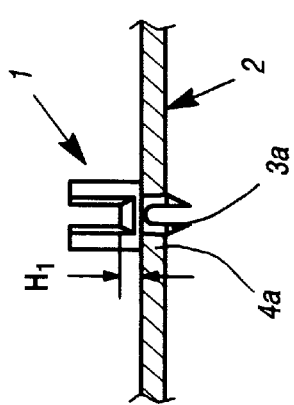
FIG. 3 is an end view of the card guide shown in FIG. 1 mounted on a computer chassis.

FIGS. 1–3 illustrate a card guide utilizing pegs to attach the card guide onto the surface of a computer chassis. The card guide 1 is configured to be mounted to a chassis 2 by means of three (3) pegs 3a, 3b, and 3c. As is illustrated in FIG. 3, peg 3a is inserted into a hole 4a formed in the chassis 2 in order to engage the card guide 1 to a surface of the chassis 2.

The card guide illustrated in FIGS. 1–3 is injection molded to a fixed length. Holes, such as hole 4a, are drilled into the chassis 2, and such holes are positioned at locations closely corresponding to locations of the pegs 3a, 3b, and 3c. The sizes of the holes conform to a pre-determined tolerance in order to maintain engagement of the pegs.

It is recognized that the pegs can break in such guard guides, and there can be interference between the leading edge of a circuit board and the edge of the base of the card guide as the circuit board is installed. Furthermore, due to the height $H_1$ of the base of the card guide (FIG. 3), which base extends upwardly above the top surface of the chassis portion, there is some loss of board size associated with the use of such card guides.

Generally, this invention provides a card guide that can be releasably engaged to a computer chassis in order to guide an edge portion of a circuit board with respect to a support member of the computer chassis. Referring to FIGS. 4–15 generally, one embodiment of a card guide 16 according to this invention includes an elongated body having flanges 34 and 35 oriented along the length of the body and a surface 36 connecting the flanges 34 and 35. The flanges 34 and 35 and the surface 36 together define an elongated recess 44 oriented along the length of the body. The recess 44 in the body of the card guide 16 is configured to receive a support member 26 of the computer chassis 12 to mount the card guide 16 to the computer chassis 12. Also, the recess 44 in the body of the card guide 16 is also configured to receive the edge portion 18 of a circuit board 14, and the flanges 34 and 35 of the body are spaced from one another to accommodate the edge portion 18 of the circuit board 14 to guide the circuit board 14 with respect to the computer chassis 12.

The card guide according to this invention is preferably formed from a plastic or polymeric material that can be extruded and cut or otherwise formed to a desired length. The card guides are most preferably formed from non-conductive materials to reduce the chance of a short circuit between the chassis and a component on a circuit board guided within the card guide. The card guide is preferably snapped over a support member of a computer chassis (such as a metal rail, for example), thereby providing an instant guide.

The card guides disclosed herein confer several advantages. First, the card guides can be installed easily and eliminate a sheet metal operation otherwise used to form card guides directly into the chassis structure. The card guides can also be easily removed, thereby allowing for easy rework during the prototype stage of a particular design project. The card guides are also inexpensive to manufacture, especially when extruded. The card guides also provide a non-conductive guide that will not limit the proximity to the circuit board's edge with which components on the circuit board can be installed or the location of components on the backplane to which the circuit board is being connected. The flanges on the guide can be made taller than a metal guide because it is a separate component and because it is non-conductive. Because the card guide is preferably extruded, it can be cut to a variety of lengths. Also, the guides do not require a structural weakening of the area where the guide is placed because the width of the guide is not restricted by any forming operation. Also, the guides do not add any height to the sheet metal guide area, thereby maximizing the size of the circuit board that can be inserted into the computer chassis.

Figure 4:
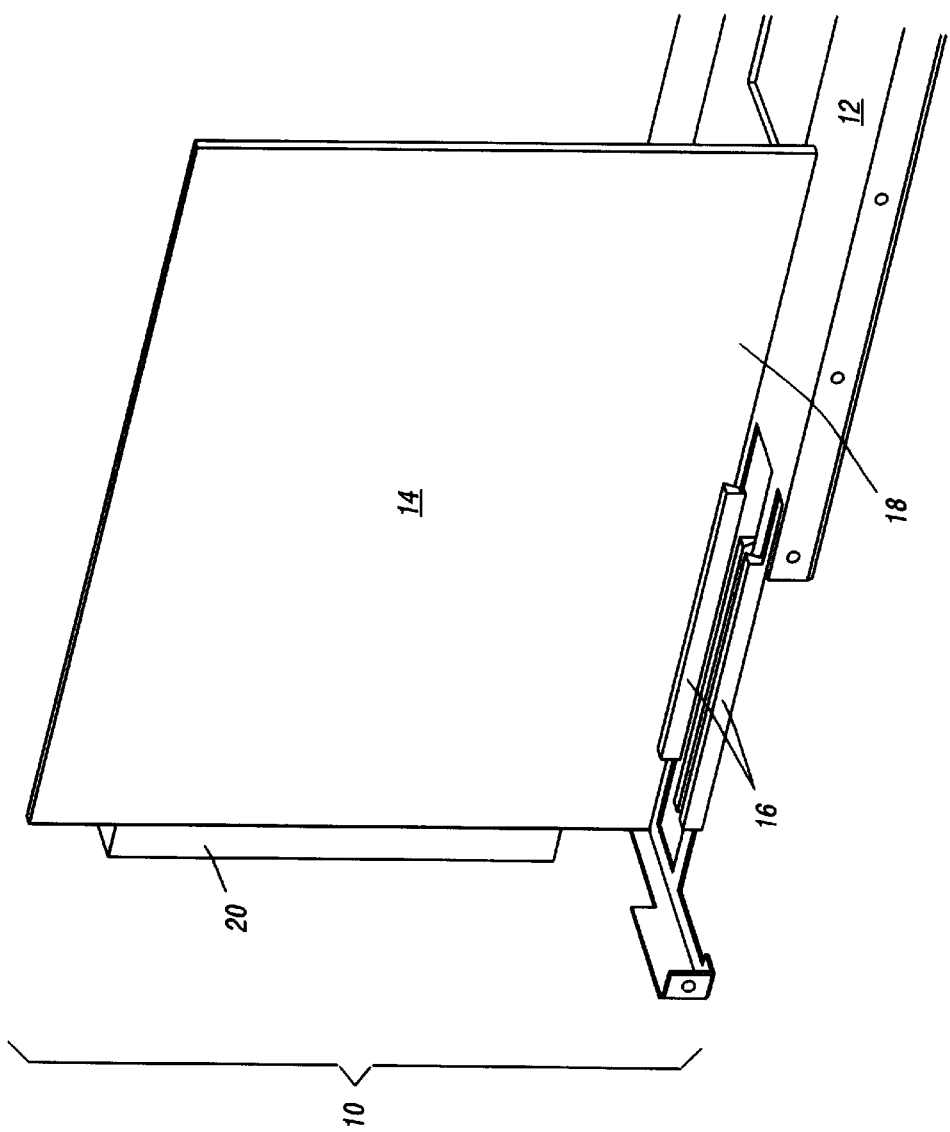
FIG. 4 is a top perspective view of an embodiment of a computer system according to this invention.

FIG. 4 illustrates a computer system 10 according to this invention. Computer system 10 includes a chassis 12 configured to receive a circuit board 14. A bottom edge portion 18 of circuit board 14 is guided upon insertion into chassis 12 by means of a card guide 16 (two shown). An interface connector 20 provided on the leading edge of circuit board 14 is provided for mating connection with a connector on the backplane of the computer system 10 (not shown).

The card guides 16 according to this invention provide for guiding alignment of circuit boards as they are inserted into the computer chassis, thereby ensuring proper orientation of the circuit board interface connectors with the mating connectors on the backplane or motherboard. Although two card guides 16 are illustrated in FIG. 4, it is of course contemplated that a single card guide 16 could be utilized in order to accommodate a single circuit board 14. Alternatively, three or more card guides 16 could also be utilized, depending upon the number of circuit boards to be installed into the computer chassis 12. Furthermore, although card guides 16 are only illustrated on one planar surface of chassis 12, it should be understood that a parallel surface of chassis 12 above circuit board 14 (not shown) would preferably include corresponding card guides 16 in order to guide the top edges of the circuit boards.

Figure 5:
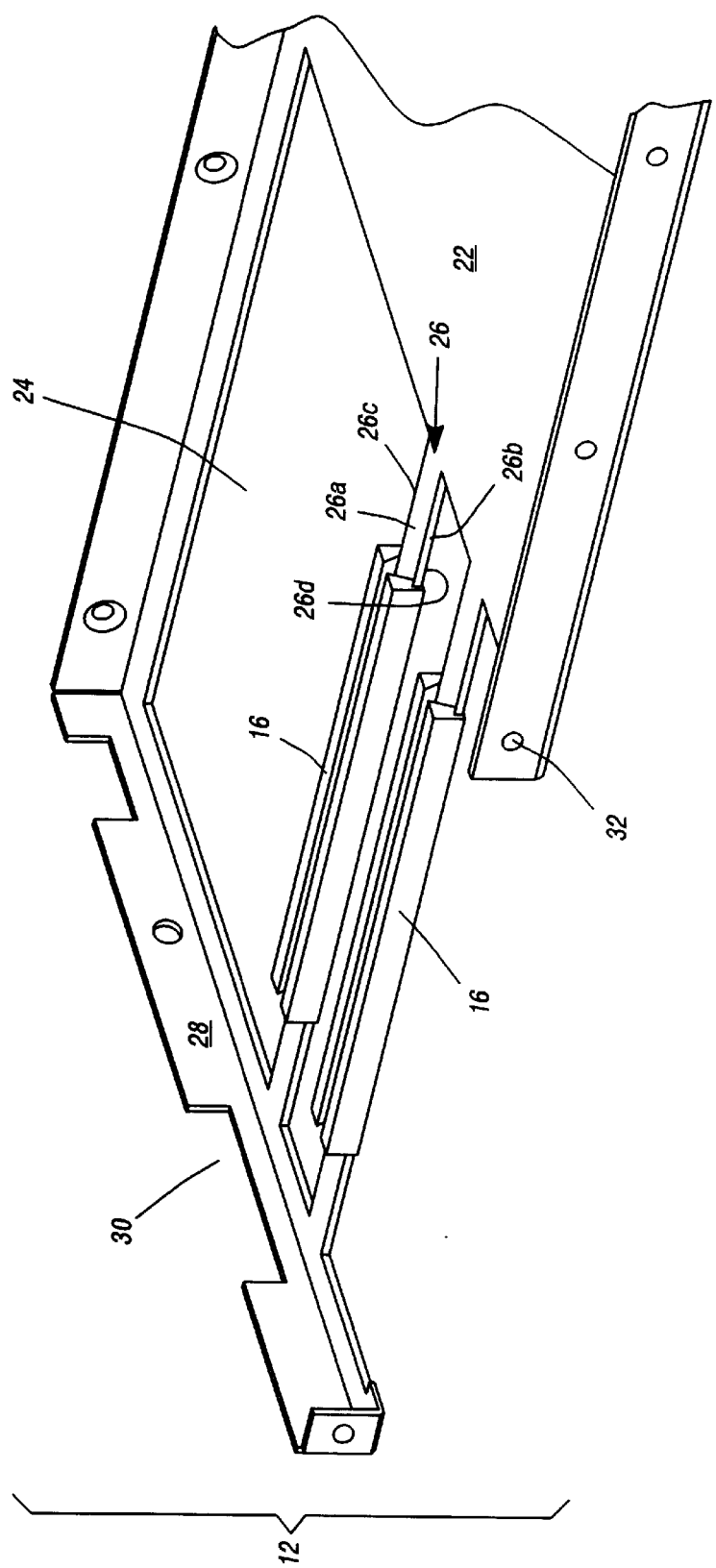
FIG. 5 is a top perspective view of an embodiment of a portion of a computer chassis according to this invention, which is adapted for use in the computer system illustrated in FIG. 4.
Figure 6:
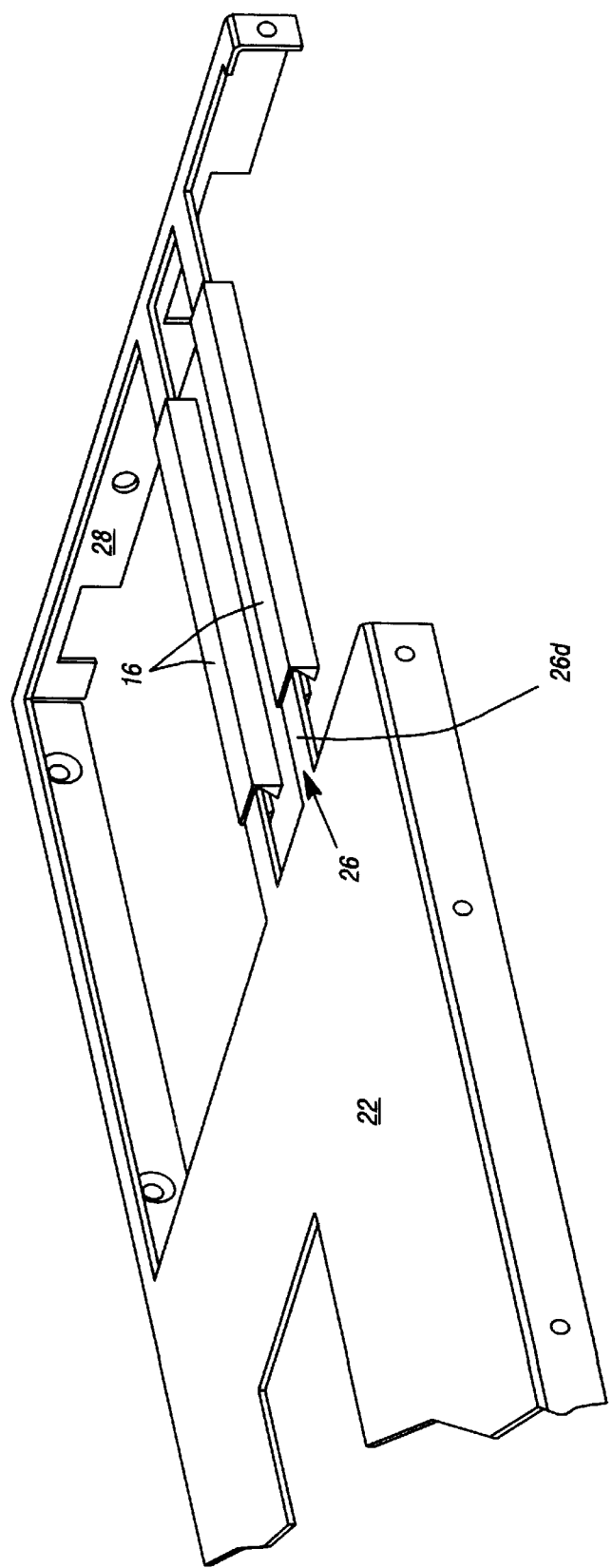
FIG. 6 is a bottom perspective view of the computer chassis shown in FIG. 5.

FIG. 5 illustrates a portion of chassis 12 of computer system 10 with the circuit board 14 removed to illustrate further details of chassis 12. Chassis 12 is preferably formed of a sheet metal structure to which the card guides 16 are engaged, as will be described later in greater detail. Specifically, chassis 12 includes a chassis surface 22 in which a plurality of openings 24 are provided to facilitate the flow of cooling air through the computer system 10. Elongated support members are provided in the form of rails 26 which extend across the openings 24 in chassis surface 22. Each of the rails 26 includes a top surface 26a, a side surface 26b, a side surface 26c, and a bottom surface 26d (see FIG. 6).

Chassis 12 also includes a flange 28 at the rear of the chassis 12, which can provide a stop surface to prevent over-insertion of a circuit board 14 into the chassis 12. More specifically, the end of bottom edge 18 of circuit board 14 contacts flange 28, thereby preventing further insertion of the circuit board 14. Also, flange 28 is provided with a recess 30 to provide access between connectors on the circuit board 14 and mating connectors on the backplane or motherboard (not shown). Chassis 12 is also provided with a series of mounting holes 32 about its periphery in order to accommodate fasteners for engagement of the chassis surface 22 to the remainder of the chassis 12 (not shown).

Figure 8:
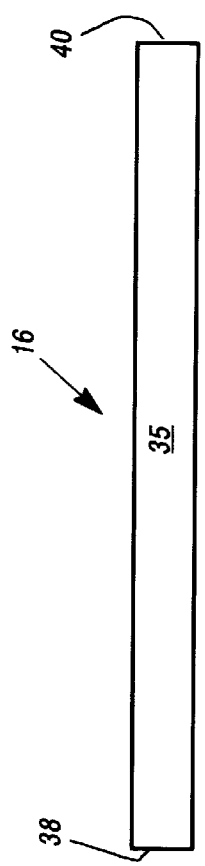
FIG. 8 is a side view of the card guide shown in FIG. 7.
Figure 9:
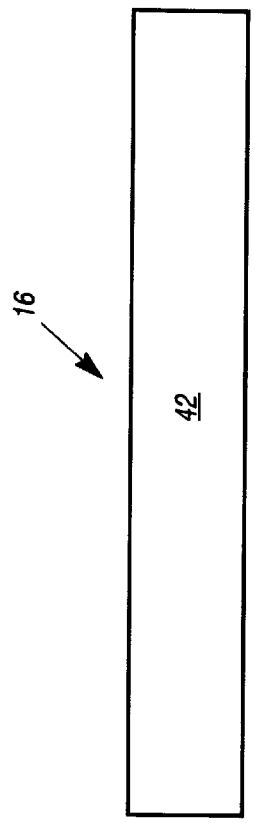
FIG. 9 is a bottom view of the card guide shown in FIG. 7.

Details of one embodiment of card guide 16 will now be described with reference to FIGS. 7–12. Card guide 16 includes a pair of substantially parallel, elongated flanges 34 and 35. A surface 36 of card guide 16 connects flanges 34 and 35. Flanges 34 and 35 are oriented along the length of card guide 16, and elongated flanges 34 and 35 preferably extend from one end surface 38 of card guide 16 to the opposite end surface 40 of card guide 16 (FIG. 8). Card guide 16 includes a base 42 which defines surface 36 connecting flanges 34 and 35.

Figure 11:
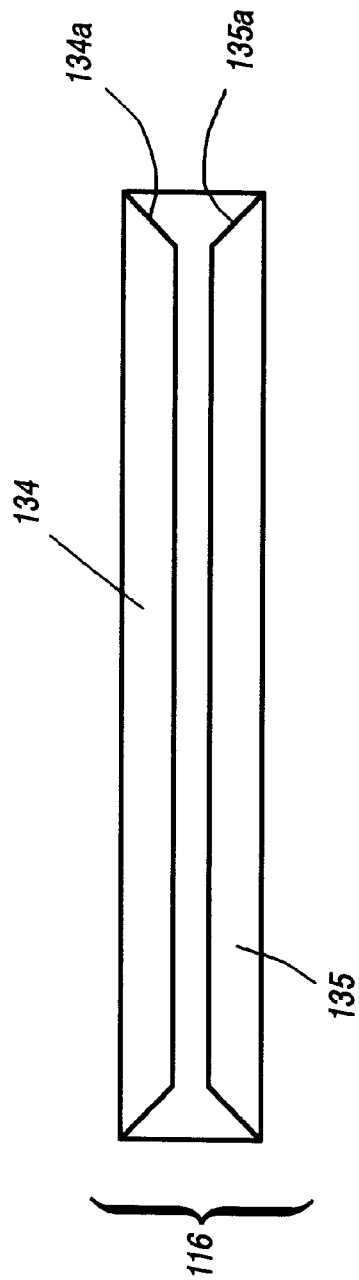
FIG. 11 is a top view of an alternative configuration of the card guide shown in FIG. 7.

In an alternative embodiment of card guide 116 illustrated in FIG. 11, elongated flanges 134 and 135 preferably include tapered surfaces 134a and 135a, respectively. As will be understood, tapered surfaces 134a and 135a provide a tapered entrance for the leading edge of a circuit board as it is inserted into the card guide. Tapered surfaces such as surfaces 134a and 135a can be provided at both ends of the card guide as illustrated in FIG. 11 (so that the card guide can be installed in any orientation). Alternatively, the tapered surfaces can be provided at one end only (thereby requiring orientation of the card guide so that the tapers receive the circuit board).

Figure 12:
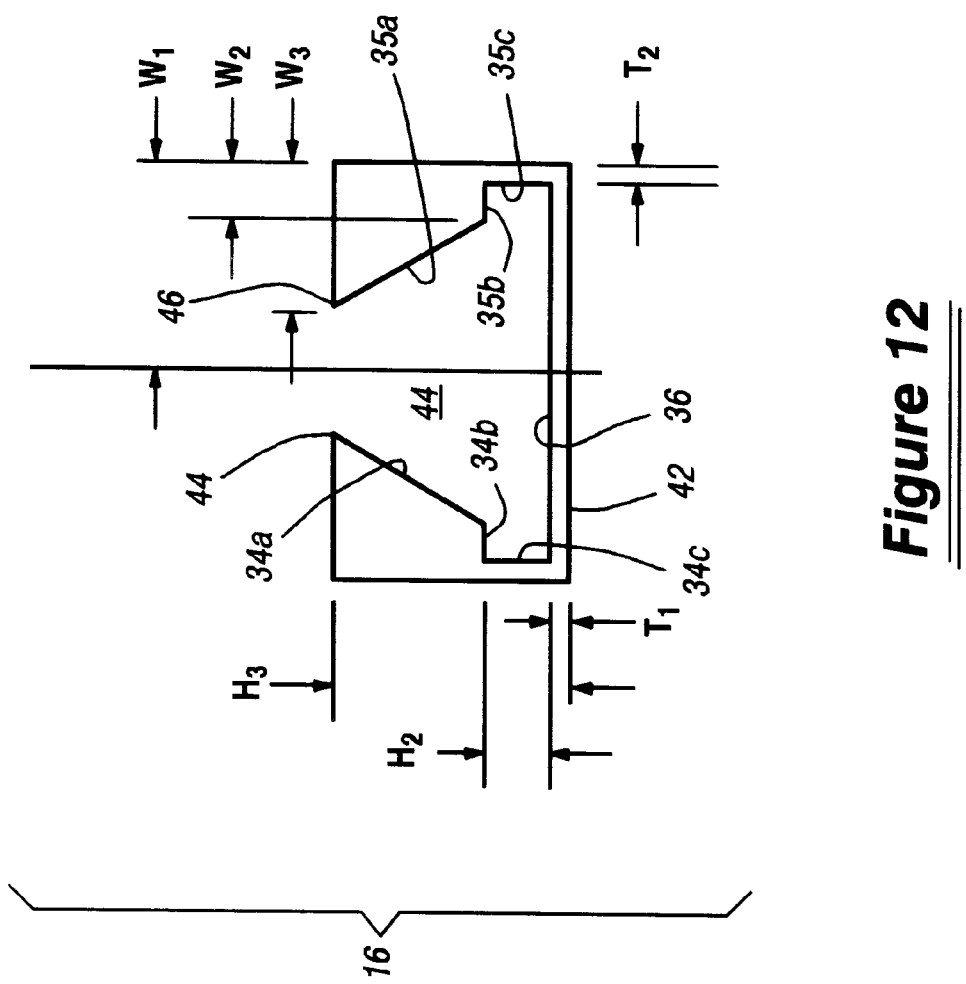
FIG. 12 is an end view of the card guide shown in FIG. 7.

Referring now to FIG. 12, card guide 16 has a substantially "U" shaped cross-sectional configuration. Elongated flanges 34 and 35 and surface 36 together define an elongated recess 44 that is oriented along the length of card guide 16 and preferably extends completely along the length of card guide 16. More specifically, recess 44 is defined by surface 36; surfaces 34a, 34b, and 34c of flange 34; and surfaces 35a, 35b, and 35c of flange 35.

Figure 13:
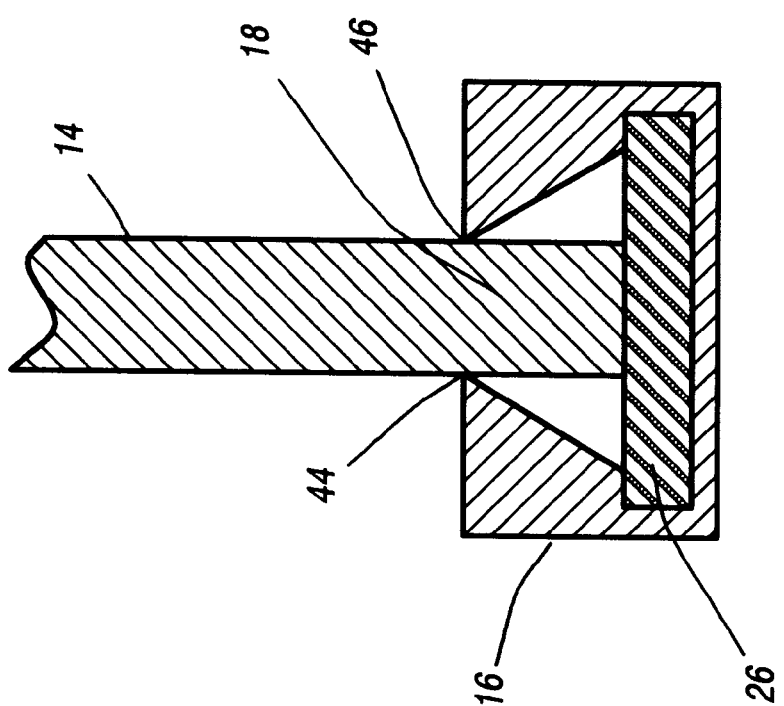
FIG. 13 is a cross-sectional end view of the card guide shown in FIG. 7 together with portions of an edge portion of a circuit board and a support member of a computer chassis.

The lower portion of recess 44 (defined by surfaces 34b and 34c of flange 34, surface 36 of base 42, and surfaces 35b and 35c of flange 35) is substantially rectangular in cross-sectional shape. This portion of recess 44 is preferably configured to receive a rail (elongated support member 26) of chassis 12. More specifically, side surfaces 26b and 26c of rail 26 (FIG. 5) fit within surfaces 34c and 35c of card guide 16. Also, surfaces 26a and 26d of rail 26 fit within surfaces 34b, 35b, and 36 of card guide 16. In this manner, the lower portion of recess 44 is sized, shaped, and configured to accommodate a rail 26 of chassis 12 in releasable engagement. The manner of engagement between card guide 16 and rail 26 is illustrated in FIG. 13.

Also, surface 34a of flange 34 and surface 35a of flange 35 converge toward one another at a location spaced from surface 36 of card guide 16. More specifically, surfaces 34a and 35a terminate at contact lines 45 and 46, respectively. These contact lines 45 and 46 provide support for opposite surfaces of a circuit board such as circuit board 14, as is illustrated in FIG. 13. In other words, the distance between flanges 34 and 35 is preferably selected to be smaller at a location spaced from surface 36 than at a location adjacent surface 36 toward the base 42 of card guide 16.

Referring specifically to FIG. 12, the lower, rectangular portion of recess 44 is provided with a height $H_2$ that is selected to accommodate the thickness of a rail 26. Card guide 16 is provided with an overall height $H_3$ that is selected to provide adequate support for the circuit board 14 while avoiding any interference between card guide 16 and any components mounted on circuit board 14.

Base 42 of card guide 16 has a thickness $T_1$ that is selected to provide sufficient strength and rigidity to card guide 16. However, thickness $T_1$ is preferably selected to provide some degree of flexibility of base 42 to facilitate the positioning of card guide 16 on rail 26, which may require some bending or deformation or flexing of base 42. Similarly, the thickness $T_2$ of the lower flange portions of card guide 16 is preferably selected to provide sufficient rigidity while maintaining at least a minimal degree of flexibility to facilitate installation.

Card guide 16 is provided with a width $W_1$ measured from the center of base 42 to the outer edge of the flanges 34 and 35. Surfaces 34b and 35b extend inwardly from the outer edge of card guide 16 a width $W_2$. The upper ends of flanges 34 and 35 have a width $W_3$ measured to the tips of the contact lines 45 and 46, respectively.

The space or gap between contact lines 44 and 46 is therefore equal to the overall width of the card guide 16 minus the sum of the widths of the top edges of the flanges 34 and 35 ($2W_1$ minus $2W_3$). The gap between contact lines 45 and 46 is selected to accommodate the thickness of the circuit board.

As is illustrated in FIG. 13, when the card guide 16 is installed on the elongated support member 26 of the computer chassis 12, and when the circuit board 14 is also installed in computer chassis 12 (thereby forming computer system 10), the card guide partially surrounds the elongated support member 26 and does not extend between the elongated support member 26 and the bottom edge of the circuit board 14. Accordingly, card guide 16 adds no height to the chassis surface 22 at the rails 26, thereby maximizing the height of the circuit board that can be used in connection with the computer system 10. In contrast, card guides that are mounted to a top or facing surface of a chassis essentially add thickness to the chassis and thereby reduce the space between the opposed supporting surfaces of the chassis. In doing so, such card guides reduce the space between the supporting surfaces of the chassis and thereby reduce the height of the circuit board that can be installed therein.

It will also be understood that card guide 16 facilitates insertion of the circuit board 14 adjacent the surface of elongated support member 26 in such a way as to eliminate interference between the leading, bottom edge of the circuit board and any edge of the card guide.

Figure 14:
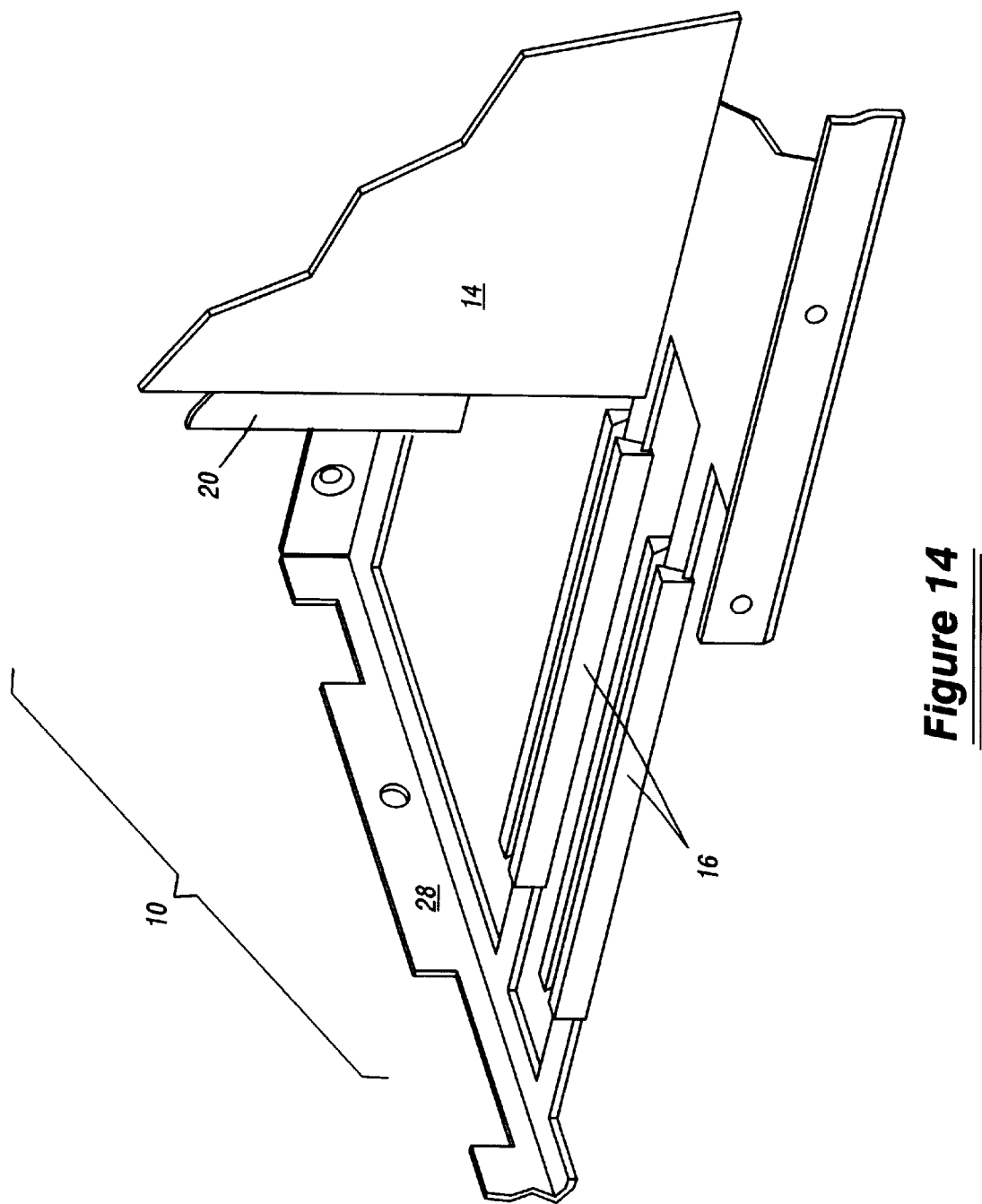
FIGS. 14 and 15 are top perspective views of the computer system illustrated in FIG. 4, as a circuit board component is installed in the computer chassis.
Figure 15:
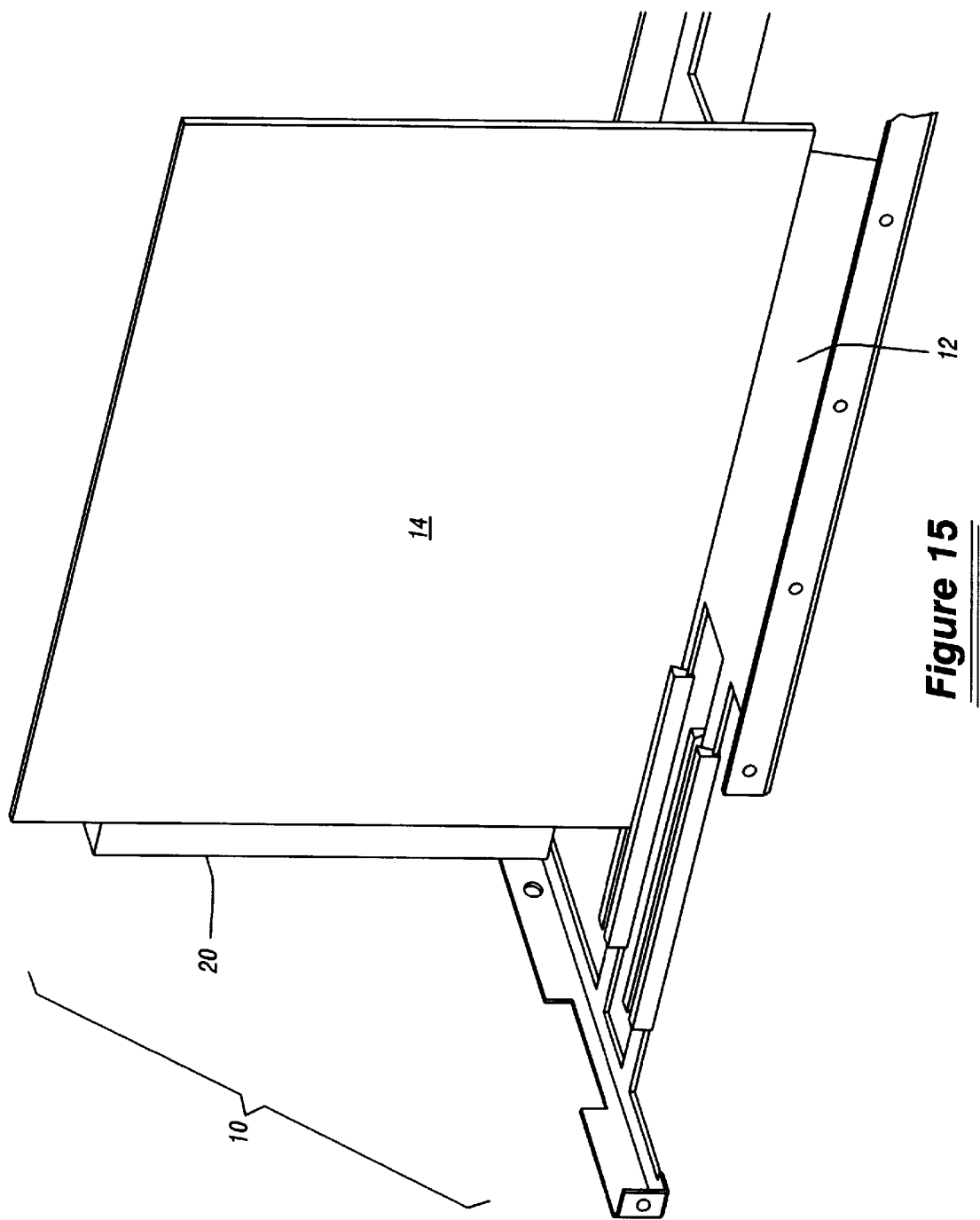

The method for guiding an edge portion of a circuit board with respect to a elongated support member of a computer chassis will now be described with reference to FIGS. 14 and 15. FIG. 14 shows a computer chassis 12 according to this invention just prior to the insertion of the circuit board 14 into the card guide 16. FIG. 15 illustrates the circuit board 14 partially inserted into the card guide 16 prior to mating of interface connector 20 with a mating connector on the motherboard or backplane (not shown).

The method accordingly includes mounting the card guide 16 to the elongated support member 26 by engaging the elongated support member 26 of the computer chassis 12 with the flanges 34 and 35 of the body of the card guide 16. The method also includes guiding the circuit board 14 with respect to the computer chassis 12 by receiving an edge portion 18 of the circuit board 14 in the recess 44 in the body of the card guide 16.

Figure 16:
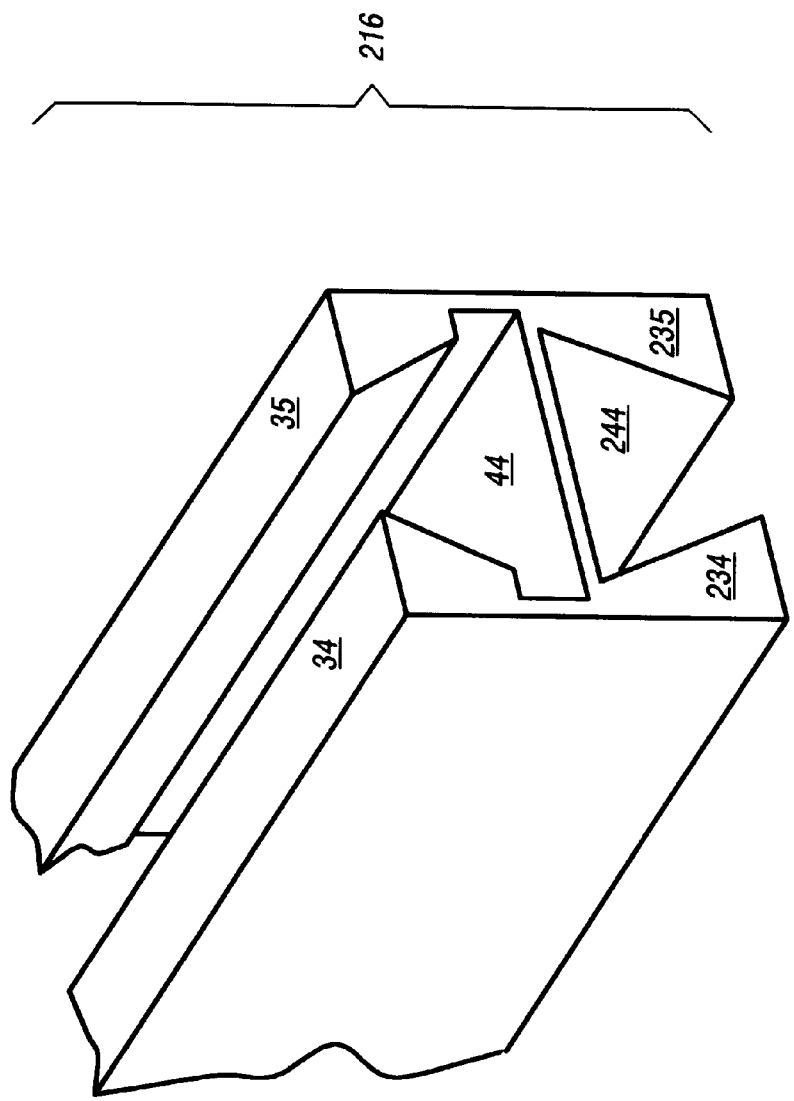
FIG. 16 is a top perspective view of another embodiment of a card guide according to this invention which is adapted for use in the computer chassis illustrated in FIG. 5 and the computer system illustrated in FIG. 4, and which is adapted for guiding an edge portion of one or more circuit boards.
Figure 17:
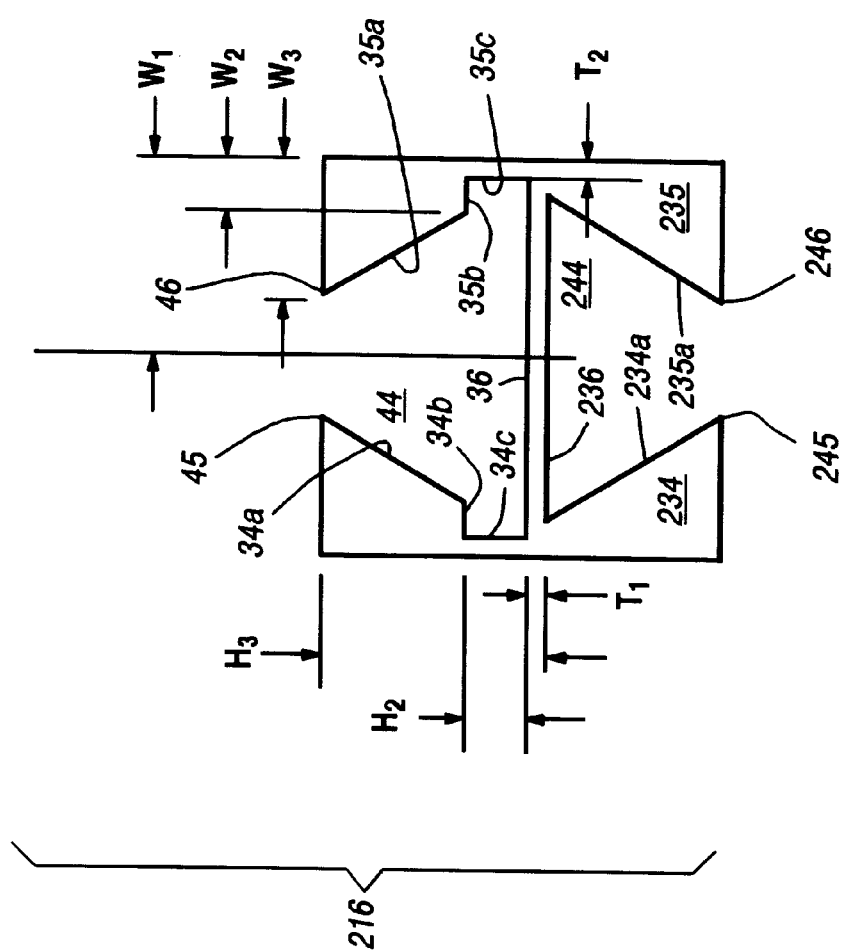
FIG. 17 is an end view of the card guide shown in FIG. 16.

According to another aspect of this invention, a card guide is provided for guiding an edge portion of at least one circuit board with respect to a computer chassis. This card guide embodiment is illustrated in FIGS. 16 and 17. Generally, this card guide embodiment is adapted to accommodate and guide edge portions of multiple printed circuit cards. For example, this embodiment is suited to guide the edge portions of stacked cards, wherein the edge portions of the stacked cards extend proximal to one another. For example, stacked printed circuit boards that are oriented along a single plane may be positioned one above the other so that the top edge of one of the cards extends proximal to the bottom edge of another card.

A card guide according to this aspect of the invention makes it possible to decrease the amount of space and material within the computer chassis that is required to support the edge portions of adjacent printed circuit boards. For example, a card guide according to this aspect of the invention makes it possible to utilize a single thickness of sheet metal separating two adjacent boards. Accordingly, the space between edge portions of adjacent circuit boards can be reduced. In other words, a more dense card configuration is made possible by saving space within the computer chassis.

Figure 7:
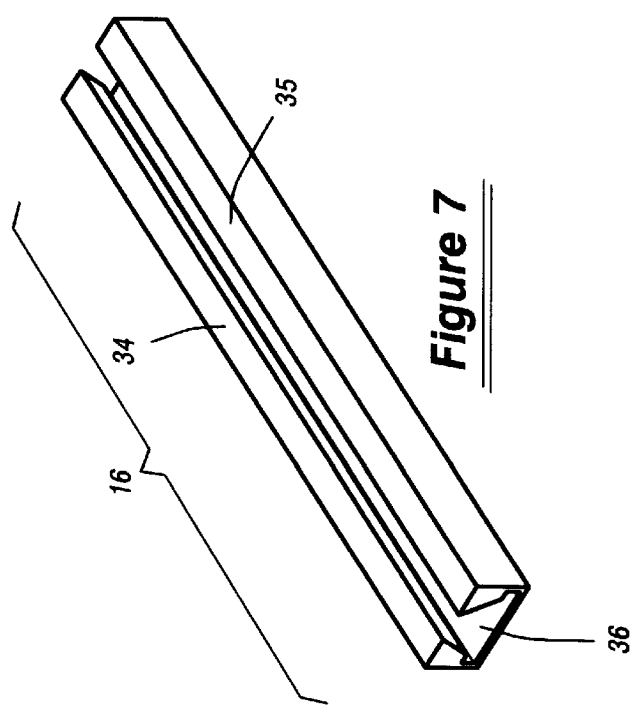
FIG. 7 is a top perspective view of an embodiment of a card guide according to this invention which is adapted for use in the computer chassis illustrated in FIG. 5 and the computer system illustrated in FIG. 4.
Figure 10:
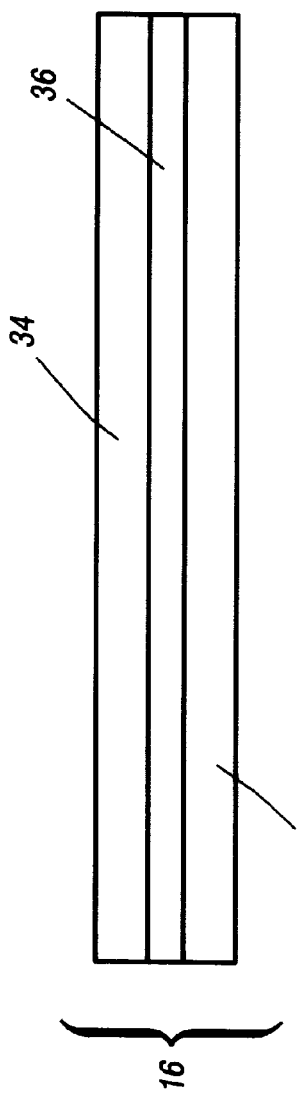
FIG. 10 is a top view of the card guide shown in FIG. 7.

Referring now to FIGS. 16 and 17, it will be noted that these figures are similar to FIGS. 7 and 12, respectively. Common reference numerals are used to refer to features that are common between card guide 16 and a card guide for guiding edge portions of multiple circuit boards, generally designated by the numeral "216". Card guide 216 differs from card guide 16 in that card guide 216 provides multiple recesses each configured to receive the edge portion of a circuit board. Specifically, card guide 216 includes flanges 34, 35, 234, and 235 defining recesses 44 and 244. At least one of the recesses 44 is configured to receive a portion of the computer chassis to mount the card guide 216 to the computer chassis. Each of the recesses 44 and 244 is configured to receive the edge portion of a circuit board, and the flanges 34 and 35 and the flanges 234 and 235 are spaced from one another to accommodate the edge portion of a circuit board to guide the circuit board with respect to the computer chassis.

Referring to FIG. 17, a second recess 244 of card guide 216 is defined by surface 234a of flange 234, surface 236 extending between flanges 234 and 235, and surface 235a of flange 235. Surfaces 234a and 235a terminate at contact lines 245 and 246, respectively. These contact lines 245 and 246 provide support for opposite surfaces of a circuit board such as circuit board 14. In other words, the distance between flanges 234 and 235, like the distance between flanges 34 and 35, is preferably selected to be smaller at a location spaced from surface 236 than at a location adjacent surface 236 toward the base 42 of card guide 216.

It will be appreciated that card guide 216 can be used to support the edge portions of two cards that are mounted along a common plane in a stacked configuration. More specifically, card guide 216 is adapted to guide edge portions of stacked cards wherein the bottom edge portion of one of the cards extends proximal to a top edge portion of another card.

It will be further appreciated that the card guide 216 can guide stacked cards while requiring only a single thickness of sheet metal or other chassis portion to extend between the edges of the cards. For example, if a portion of the chassis is engaged within recess 44 of card guide 216 (i.e., engaged by the surfaces 34b, 34c, 36, 35b, and 35c in the lower portion of recess 44), then a bottom edge portion of a card can be guided within recess 44 and a top edge portion of another stacked card can be guided within recess 244. The space between the bottom edge portion of the top stacked card and the top edge portion of the bottom stacked card is thereby minimized. For example, the space between the stacked cards can be as small as the combined thicknesses of a support member of the computer chassis (having a thickness approximating the height $H_2$ of the lower portion of recess 44) and the thickness $T_1$ of the base portion 42 of the card guide 216.

Although only one recess (i.e., recess 44) of card guide 216 is specifically configured to receive a portion of the chassis for mounting the card guide 216 to the chassis, it will be appreciated that each of the recesses 44 and 244 can be configured to provide such engagement. In fact, it may be preferred to configure each of the recesses to engage a portion of the chassis so as to avoid incorrect mounting of the card guide 216 on the chassis (i.e., by attempting to engage card guide 216 to the chassis using recess 244 as opposed to recess 44).

Also, although only two recesses 44 and 244 are provided in the embodiment of card guide 216 illustrated in FIG. 17, it will be appreciated that additional flanges can be provided so as to define three or more recesses. For example, if stacked cards are oriented with a top stacked card over two additional stacked cards that are situated to extend parallel to one another, an additional flange can be provided between flanges 234 and 235 in order to define multiple downwardly-facing recesses in order to accommodate the top edge portions of the lower stacked cards. Also, additional flanges could be provided to extend sidewardly from the card guide 216 illustrated in FIG. 17, thereby defining one or more additional recesses to guide edge portions of cards that extend sidewardly.

Furthermore, it will be appreciated that, although card guide 216 is configured to guide edge portions of stacked cards that are oriented along a common plane, it will be appreciated that card guide 216 can be adapted to guide edge portions of cards that occupy different planes. For example, for purposes of illustration, flanges 234 and 235 of card guide 216 could be positioned to extend sidewardly from flange 34 or 35, thereby defining recesses that extend at an angle (e.g., perpendicular) with respect to one another.

Figure 18:
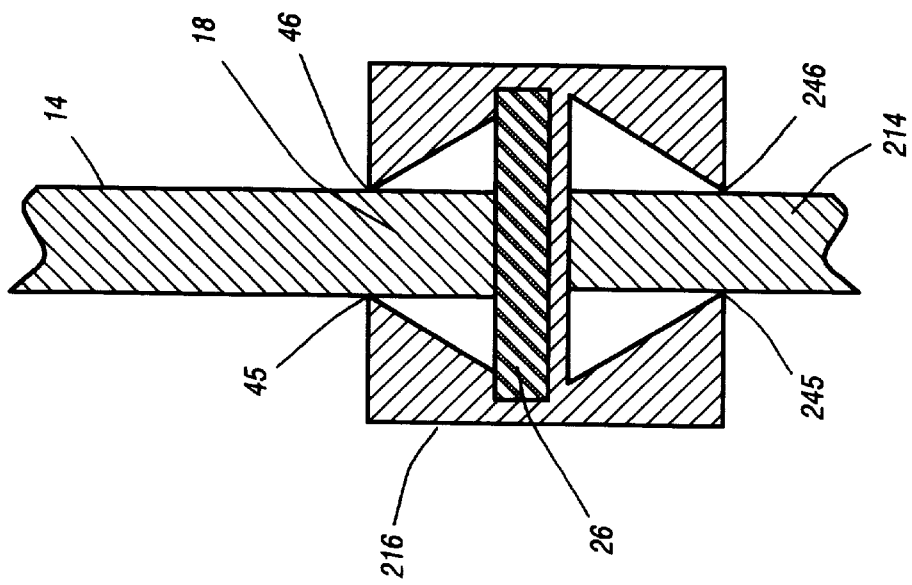
FIG. 18 is a cross-sectional end view of the card guide shown in FIG. 16 together with edge portions of circuit boards and a support member of a computer chassis.

As is illustrated in FIG. 18, when the card guide 216 is installed on an elongated support member 26 of the computer chassis 12, and when circuit boards 14 and 214 are also installed in computer chassis 12 (thereby forming computer system 10), the card guide 216 partially surrounds the elongated support member 26 and does not extend between the elongated support member 26 and the bottom edge of the circuit board 14. Contact lines 45 and 46 thereby support the edge portion 18 of circuit board 14. At the same time, a second circuit board 214 having an edge portion 218 can be accommodated within recess 244 of card guide 216. Contact lines 245 and 246 therefore support the edge portion 218 of circuit card 214.

As is illustrated in FIG. 18, cards 14 and 214 share a common plane. As noted previously, however, card guide 216 can be modified such that cards 14 and 214 can occupy separate planes. Nevertheless, FIG. 18 illustrates that a minimal spacing can be provided between the bottom edge of card 14 and the top edge of card 214 while providing guiding support for cards 14 and 214.

Although this invention has been described with reference to specific embodiments selected for illustration in the drawings, as well as particular variations and modifications thereof, it will be appreciated that further modifications and variations can be made without the departing from the spirit or scope of this invention. Although it is preferred to provide a card guide having a substantially constant cross-sectional shape along its length in order facilitate its formation by inexpensive extrusion processes, it will be appreciated that tapered flanges (FIG. 11) or other changes in the cross-sectional shape can be provided and that the card guide can be formed using conventional injection molding procedures or other known manufacturing techniques.

Also, although polymeric, non-conductive materials are preferred for forming the card guide according to this invention, it is recognized that the card guide can be formed from a wide variety of polymeric or metallic materials, depending upon the particular application for the card guide. The card guide according to this invention is preferably releasably engagable to the chassis so that it can be subsequently removed, if desired. Alternatively, the dimensions selected for a particular card guide and the associated chassis can result in a permanent engagement or a separate fastening mechanism or adhesive can be utilized to hold the card guide in place.

Although each card guide embodiment described herein includes a continuous, elongated recess formed from continuous, elongated flanges and a continuous elongated surface, it is also contemplated that one or more short card guides can be provided instead. More specifically, for example, two or more short lengths of the card guide 16 or 216 can be mounted to a computer chassis with a space between them so that they together define a discontinuous channel or recess along which a circuit board's edge is guided. Alternatively, the base 42 of the card guide can be a continuous, elongated structure, and the flanges can be provided in separate portions along the length of the base, thereby forming a discontinuous recess while providing adequate support for a circuit board.

Other variations and modifications can be made within the scope of this invention, which is separately defined in the appended claims.

What is claimed is:

1. A card guide for guiding an edge portion of at least one circuit board with respect to a computer chassis, said card guide comprising:
    flanges defining recesses;
    at least one of said recesses being configured to receive a support member of a computer chassis to mount said card guide to the computer chassis; and
    each of said recesses being configured to receive an edge portion of a circuit board, and said flanges defining said recesses being spaced from one another to accommodate the edge portion of the circuit board to guide the circuit board with respect to the computer chassis.

2. The card guide recited in claim 1, further comprising a surface connecting a pair of said flanges and configured to extend adjacent a surface of the computer chassis.

3. The card guide recited in claim 2, wherein the space between said pair of flanges is largest at a location adjacent said surface connecting said pair of flanges.

4. The card guide recited in claim 1, at least a portion of said at least one recess having a substantially rectangular cross-sectional shape.

5. The card guide recited in claim 1, said flanges being formed along an elongated body, said elongated body having a substantially constant cross-sectional shape.

6. The card guide recited in claim 5, said cross-sectional shape of said elongated body being substantially "H" shaped.

7. A computer chassis configured to receive at least one circuit board, said computer chassis comprising:
    an elongated support member; and
    a card guide mounted to said elongated support member, said card guide having an elongated body having flanges oriented along the length of said body, said flanges defining elongated recesses oriented along the length of said body;
    one of said recesses in said body of said card guide receiving said elongated support member and said flanges defining said recess engaging said elongated support member; and
    each of said recesses in said body of said card guide being configured to receive an edge portion of a circuit board and said flanges defining each of said recesses being spaced from one another to accommodate the edge portion of a circuit board to guide the circuit board with respect to said elongated support member.

8. The computer chassis recited in claim 7, said card guide being releasably mounted to said elongated support member.

9. The computer chassis recited in claim 7, said elongated support member comprising a rail.

10. The computer chassis recited in claim 7, further comprising a surface connecting a pair of said flanges, wherein the distance between said flanges along said surface connecting said pair of flanges corresponds substantially to the width of said elongated support member.

11. The computer chassis recited in claim 10, wherein the distance between said flanges at a location spaced from said surface connecting said pair of flanges is smaller than the width of said elongated support member.

12. A computer system comprising:
    a chassis having an elongated support member;
    at least one circuit board having an edge portion positioned adjacent said elongated support member of said chassis; and
    a card guide mounted to said elongated support member of said chassis, said card guide having an elongated body having flanges oriented along the length of said body, said flanges defining elongated recesses oriented along the length of said body;
    one of said recesses in said body of said card guide receiving said elongated support member of said chassis, and said flanges defining said recess engaging said elongated support member of said chassis; and
    at least one of said recesses in said body of said card guide receiving said edge portion of said at least one circuit board and said flanges defining said recess of said body of said card guide accommodating said edge portion of said circuit board to guide said circuit board with respect to said elongated support member of said chassis.

13. The computer chassis recited in claim 12, said card guide being releasably mounted to said elongated support member.

14. The computer chassis recited in claim 12, said elongated support member comprising a rail.

15. The computer chassis recited in claim 12, further comprising a surface connecting a pair of said flanges, wherein the distance between said flanges along said surface connecting said pair of flanges corresponds substantially to the width of said elongated support member.

16. The computer chassis recited in claim 15, wherein the distance between said flanges at a location spaced from said surface connecting said pair of flanges is smaller than the width of said elongated support member.

17. The computer system recited in claim 16, wherein the distance between said flanges at said location spaced from said surface connecting said pair of flanges corresponds substantially to the thickness of said circuit board.

18. The computer system recited in claim 17, wherein said flanges contact surfaces of said circuit board.

19. The computer system recited in claim 12, wherein said flanges of said card guide are tapered at at least one end of said card guide to facilitate the insertion of said edge portion of said circuit board into said recess of said body of said card guide.

20. A method for guiding edge portions of circuit boards with respect to an elongated support member of a computer chassis, said method comprising the steps of:

(a) providing a card guide having flanges defining elongated recesses;

(b) engaging the elongated support member of the computer chassis with a pair of the flanges of the card guide; and (c) guiding the circuit boards with respect to the computer chassis by receiving the edge portions of the circuit boards in the recesses of the card guide.

21. The card guide recited in claim 1, said flanges defining recesses oriented along a plane to guide circuit boards along said plane.

22. The card guide recited in claim 1, comprising at least two pairs of flanges, each of said pairs defining one of said recesses.

23. A card guide for guiding an edge portion of at least one circuit board with respect to a computer chassis, said card guide comprising:

flanges defining recesses, each of said recesses providing an elongated channel;

at least one of said recesses being configured to receive a portion of a computer chassis; and each of said recesses being configured to receive an edge portion of a circuit board, and said flanges defining said recesses being spaced from one another to accommodate the edge portion of the circuit board to guide the circuit board with respect to the computer-chassis.

24. A card guide for guiding an edge portion of at least one circuit board with respect to a computer chassis, said card guide comprising:

flanges defining recesses;

at least one of said recesses being configured to receive a support member of a computer chassis; and each of said recesses being configured to receive an edge portion of a circuit board, and said flanges defining said recesses being spaced from one another to accommodate the edge portion of the circuit board to guide the circuit board with respect to the computer chassis.

25. A card guide for guiding an edge portion of at least one circuit board with respect to a computer chassis, said card guide comprising:

flanges defining at least one recess;

said recess being configured to receive a support member of a computer chassis; and said recess being configured to receive an edge portion of a circuit board, and said flanges defining said recess being spaced from one another to accommodate the edge portion of the circuit board-to guide the circuit board with respect to the computer chassis.

* * * * *